United States Patent
Li

(10) Patent No.: US 12,321,201 B2
(45) Date of Patent: Jun. 3, 2025

(54) SHAFT MECHANISM FOR FOLDING ELECTRONIC DEVICE, HOUSING ASSEMBLY AND ELECTRONIC DEVICE

(71) Applicant: GUANGDONG OPPO MOBILE TELECOMMUNICATIONS CORP., LTD., Guangdong (CN)

(72) Inventor: Mingyang Li, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 322 days.

(21) Appl. No.: 18/057,034

(22) Filed: Nov. 18, 2022

(65) Prior Publication Data

US 2023/0077824 A1     Mar. 16, 2023

Related U.S. Application Data

(63) Continuation of application No. PCT/CN2021/085654, filed on Apr. 6, 2021.

(30) Foreign Application Priority Data

May 25, 2020 (CN) .......................... 202010448130.7

(51) Int. Cl.
*G06F 1/16*     (2006.01)
*F16C 11/04*     (2006.01)
(Continued)

(52) U.S. Cl.
CPC ............ *G06F 1/1656* (2013.01); *F16C 11/10* (2013.01); *F16C 11/12* (2013.01); *G06F 1/1616* (2013.01);
(Continued)

(58) Field of Classification Search
CPC .... G06F 1/1656; G06F 1/1616; G06F 1/1652; G06F 1/1681; H04M 1/0216; F16C 11/10; F16C 11/12; F16C 11/04; H05K 5/0217
See application file for complete search history.

(56) References Cited

U.S. PATENT DOCUMENTS

| | | | |
|---|---|---|---|
| 6,191,937 B1 * | 2/2001 | Bang ...................... | G06F 1/1616 16/354 |
| 6,694,570 B2 * | 2/2004 | Chen ...................... | G06F 1/1681 16/365 |

(Continued)

FOREIGN PATENT DOCUMENTS

| CN | 202926863 | 5/2013 |
|---|---|---|
| CN | 105468091 | 4/2016 |

(Continued)

OTHER PUBLICATIONS

EPO, Extended European Search Report for EP Application No. 21812953.4, Nov. 8, 2023.
(Continued)

*Primary Examiner* — Allen L Parker
*Assistant Examiner* — Martin Antonio Asmat Uceda
(74) *Attorney, Agent, or Firm* — Hodgson Russ LLP

(57) ABSTRACT

A rotating shaft mechanism for folding an electronic device, a housing assembly and an electronic device are provided. The rotating shaft mechanism includes a supporting frame, a rotating member and a resilient piece. An end of the rotating member is rotatably disposed on the supporting frame; and the resilient piece is disposed on the supporting frame and is configured to apply a damping force to the rotating member.

20 Claims, 6 Drawing Sheets

(51) Int. Cl.
*F16C 11/10* (2006.01)
*F16C 11/12* (2006.01)
*H04M 1/02* (2006.01)
*H05K 5/02* (2006.01)

(52) U.S. Cl.
CPC .......... *G06F 1/1652* (2013.01); *G06F 1/1681* (2013.01); *H05K 5/0217* (2013.01); *F16C 11/04* (2013.01); *H04M 1/0216* (2013.01)

(56) References Cited

U.S. PATENT DOCUMENTS

| | | | | |
|---|---|---|---|---|
| 6,862,779 B1* | 3/2005 | Lu | ................ | G06F 1/1616 16/337 |
| 6,886,221 B2* | 5/2005 | Minami | ............. | H04M 1/0216 361/679.01 |
| 7,114,218 B1* | 10/2006 | Lin | ................ | G06F 1/1681 16/342 |
| 7,430,786 B1* | 10/2008 | Jian | ................ | G06F 1/1679 16/303 |
| 7,555,119 B2* | 6/2009 | Yang | ................ | H04M 1/0216 379/433.11 |
| 7,644,473 B2* | 1/2010 | Chen | ................ | G06F 1/1601 16/340 |
| 7,765,644 B2* | 8/2010 | Ueyama | ............. | H04M 1/022 16/354 |
| 7,907,415 B2* | 3/2011 | Ueyama | ............. | G06F 1/1681 361/755 |
| 8,074,322 B2* | 12/2011 | Wang | ................ | G06F 1/1616 16/342 |
| 8,104,144 B2* | 1/2012 | Wang | ................ | G06F 1/1681 16/354 |
| 8,151,415 B2* | 4/2012 | Wang | ................ | H05K 5/0226 16/386 |
| 8,205,301 B2* | 6/2012 | Wang | ................ | G06F 1/1681 16/303 |
| 8,266,834 B2* | 9/2012 | Chen | ................ | F16M 13/00 248/688 |
| 8,296,905 B2* | 10/2012 | Zhang | ................ | G06F 1/1681 16/366 |
| 8,302,260 B2* | 11/2012 | Chen | ................ | G06F 1/1681 16/303 |
| 8,474,101 B2* | 7/2013 | Wang | ................ | G06F 1/1681 16/354 |
| 8,782,853 B2* | 7/2014 | Ge | ................ | H04M 1/0202 248/292.12 |
| 9,001,526 B2* | 4/2015 | Sip | ................ | G06F 1/1615 361/728 |
| 9,547,341 B2* | 1/2017 | Aono | ................ | G06F 1/1681 |
| 9,612,626 B2* | 4/2017 | Onda | ................ | G06F 1/1681 |
| 9,740,240 B1* | 8/2017 | Matsumoto | ............ | G06F 1/1632 |
| 9,976,326 B2* | 5/2018 | Huang | ................ | G06F 1/1681 |
| 10,152,094 B1* | 12/2018 | Holung | ............. | E05D 3/122 |
| 10,876,337 B2* | 12/2020 | Lin | ................ | E05D 15/06 |
| 11,726,530 B2* | 8/2023 | Kang | ................ | G06F 1/1681 361/679.27 |
| 11,797,058 B2* | 10/2023 | Lin | ................ | G06F 1/203 |
| 2005/0241108 A1* | 11/2005 | Yang | ................ | G06F 1/1679 16/366 |
| 2009/0189048 A1* | 7/2009 | Gan | ................ | F16M 11/24 248/422 |
| 2010/0226089 A1* | 9/2010 | Wang | ................ | G06F 1/1681 361/679.01 |
| 2022/0377920 A1* | 11/2022 | Zheng | ................ | G06F 1/1681 |

FOREIGN PATENT DOCUMENTS

| | | |
|---|---|---|
| CN | 105979032 | 9/2016 |
| CN | 207051771 | 2/2018 |
| CN | 108965500 | 12/2018 |
| CN | 109270987 | 1/2019 |
| CN | 210218394 | 3/2020 |
| CN | 111147630 | 5/2020 |
| CN | 111147637 | 5/2020 |
| JP | 2013104461 | 5/2013 |

OTHER PUBLICATIONS

WIPO, International Search Report and Written Opinion for PCT/CN2021/085654, Jun. 24, 2021.
CNIPA, First Office Action for CN Application No. 202010448130.7, Mar. 28, 2022.
CNIPA, Notification to Grant Patent Right for Invention for CN Application No. 202010448130.7, Aug. 3, 2022.

* cited by examiner

SHAFT MECHANISM FOR FOLDING ELECTRONIC DEVICE, HOUSING ASSEMBLY AND ELECTRONIC DEVICE

CROSS-REFERENCE TO RELATED APPLICATIONS

This application is a continuation of International Application No. PCT/CN2021/085654, filed Apr. 6, 2021, which claims priority to Chinese Patent Application No. 202010448130.7, filed May 25, 2020, the entire disclosures of which are incorporated herein by reference.

TECHNICAL FIELD

The disclosure relates to the field of communication device technologies, and more particularly, to a rotating shaft mechanism for folding an electronic device, a housing assembly, and an electronic device.

BACKGROUND

In the field of communication device technologies, for many foldable electronic devices, left and right housings of the electronic device are in a shaky state during the process of folding and unfolding, resulting in an unsatisfactory usage experience.

SUMMARY

Embodiments of the disclosure are to provide a rotating shaft mechanism for folding an electronic device, a housing assembly for folding an electronic device, and an electronic device to solve.

The disclosure provides a housing assembly for folding an electronic device, the housing assembly includes the aforementioned rotating shaft mechanism.

The disclosure provides an electronic device, the electronic device includes the aforementioned housing assembly.

According to some embodiments of the disclosure, the rotating shaft mechanism for folding the electronic device includes a supporting frame, a rotating member, and a resilient piece configured to apply a damping force to the rotating member. An end of the rotating member is rotatably disposed on the supporting frame, and the resilient piece is disposed on the supporting frame.

According to some embodiments of the disclosure, the housing assembly for folding the electronic device includes a fixed shaft, two rotating shaft mechanisms for folding the electronic device as described above, a first housing, and a second housing. Both of the supporting frames of the two rotating shaft mechanisms are disposed on the fixed shaft and spaced apart from each other. The first housing is fixedly connected to an end of the rotating member of one of the two rotating shaft mechanisms that is far away from the corresponding supporting frame. The second housing is fixedly connected to an end of the rotating member of the other one of the two rotating shaft mechanisms that is far away from the corresponding supporting frame, and the first housing and the second housing are arranged to be stacked when the electronic device is in a folded state.

According to some embodiments of the disclosure, the electronic device includes the above housing assembly for folding the electronic device and a display screen, a portion of the display screen is disposed on the first housing, and another portion of the display screen is disposed on the second housing.

BRIEF DESCRIPTION OF THE DRAWINGS

The above and/or additional aspects and advantages of the disclosure will become apparent and more readily appreciated from the following descriptions of the embodiments in conjunction with the drawings.

DETAILED DESCRIPTION OF PREFERRED EMBODIMENTS

Figure 1:
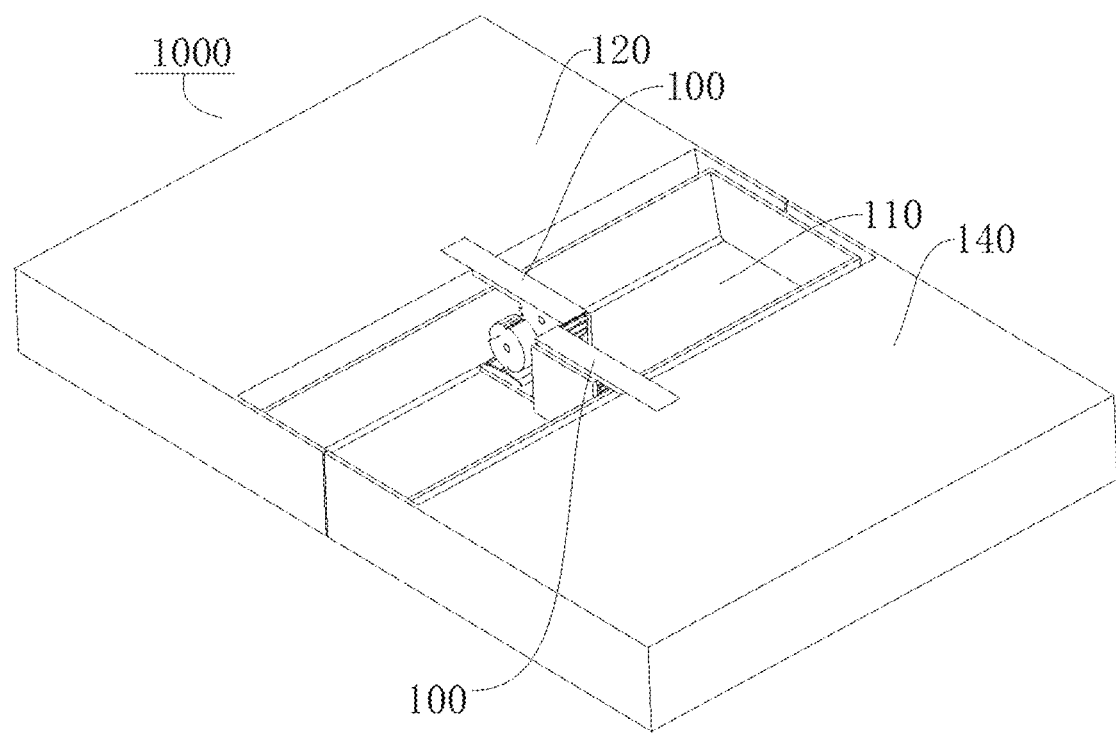
FIG. 1 is a schematic structural diagram illustrating a housing assembly for folding an electronic device according to some embodiments of the disclosure.

Hereinafter, the embodiments of the disclosure are described in detail. Examples of the embodiments are shown in the drawings, where the same or similar reference signs represent the same or similar elements or elements having the same or similar functions. The embodiments described hereinafter with reference to the drawings are exemplary, which are only intended to explain the disclosure and should not be construed as a limitation to the disclosure.

Hereinafter, a rotating shaft mechanism 100 for folding an electronic device, a housing assembly 1000 for folding an electronic device, and an electronic device according to some embodiments of the disclosure are described with reference to the drawings. The housing assembly 1000 may include the rotating shaft mechanism 100. The rotating shaft mechanism 100 may enable the electronic device with an unfolding function and a folding function, for example, the electronic device may be unfolded during use to facilitate the use of the electronic device, and the electronic device may be folded after use to facilitate the storage of the electronic device.

Figure 2:
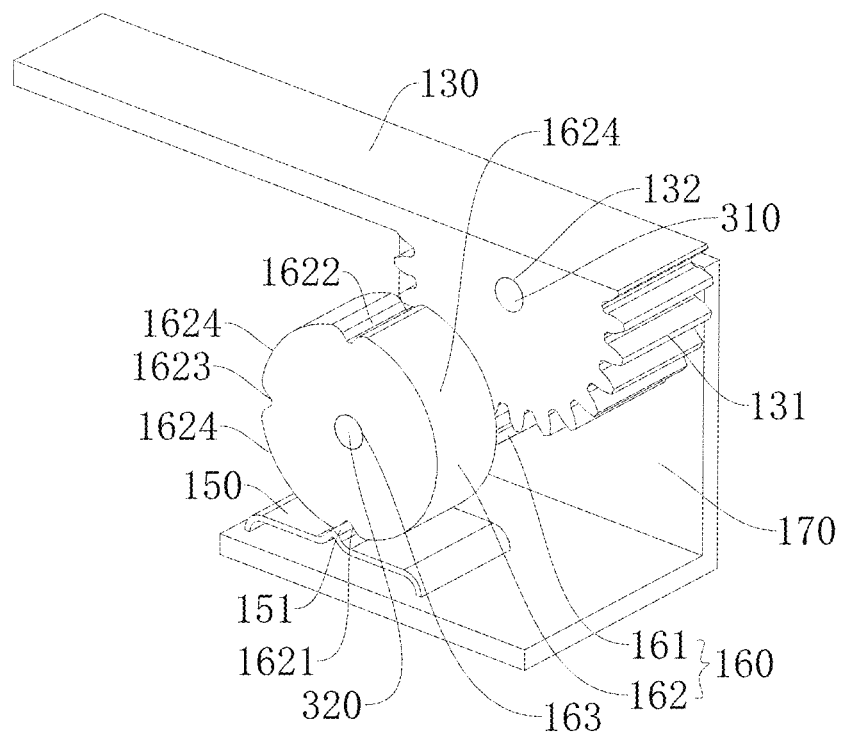
FIG. 2 is a schematic structural diagram illustrating a rotating shaft mechanism for folding an electronic device according to some embodiments of the disclosure.

As illustrated in FIG. 1 and FIG. 2, the rotating shaft mechanism 100 for folding the electronic device according to the disclosure includes a supporting frame 170, a rotating member 130, and a resilient piece 150 configured to apply a damping force to the rotating member 130.

Specifically, an end of the rotating member 130 is rotatably disposed on the supporting frame 170, the resilient piece 150 is disposed on the supporting frame 170. During the rotation of the rotating member 130, the resilient piece 150 may apply the damping force to the rotating member 130, the damping force may hinder the rotation of the rotating member 130, thereby enabling a stabilized rotation process of the rotating member 130.

The electronic device may include a fixed shaft 110, a first housing 120, and a second housing 140. Both of the first housing 120 and the second housing 140 are rotatably disposed on the fixed shaft 110. When the electronic device is in a folded state, the first housing 120 and the second housing 140 are stacked, that is, an angle (also referred to as a second angle) between the first housing 120 and the second housing 140 may be 0°. and when the first housing 120 and the second housing 140 are in an unfolded state, an angle (also referred to as a first angle) between the first housing 120 and the second housing 140 may be 180°. When the rotating shaft mechanism 100 is applied to an electronic device, the electronic device may be provided with two rotating shaft mechanisms 100. Specifically, the first housing 120 may be fixedly connected to an end of the rotating member 130 of one rotating shaft mechanism 100 that is far away from the corresponding supporting frame 170, the second housing 140 may be fixedly connected to an end of the rotating member 130 of the other rotating shaft mechanism 100 that is far away from the corresponding supporting frame 170, and the supporting frame 170 may be fixed on the fixed shaft 110.

Specifically, when the first housing 120 is manually rotated in a direction towards the second housing 140, the first housing 120 may drive the rotating member 130 to rotate relative to the fixed shaft 110, thereby folding the first housing 120 towards the second housing 140. At this time, the first housing 120 and the second housing 140 are arranged to be stacked. When the first housing 120 is manually rotated in a direction far away from the second housing 140, the first housing 120 may drive the rotating member 130 to rotate relative to the fixed shaft 110, thereby unfolding the first housing 120 and the second housing 140. At this time, the first housing 120 and the second housing 140 are located in the same plane, and the first housing 120 is rotated to a position where the angle between the first housing 120 and the second housing 140 is 180°. During the rotation of the rotating member 130, the resilient piece 150 may apply the damping force to the rotating member 130 to hinder the rotation of the rotating member 130, so that the rotation process of the rotating member 130 may be more stable, thereby enabling the first housing 120 to move towards or far away from the second housing 140 smoothly. In this way, the user comfort can be enhanced.

In the related art, the left and right housings of many foldable electronic devices are in the shaky state during the process of folding and unfolding the electronic device, resulting in an unsatisfactory usage experience. The rotating shaft mechanism 100 according to the disclosure is provided with the resilient piece 150, the resilient piece 150 is configured to apply the damping force to the rotating member 130, so that the rotation process of the rotating member 130 may be more stable. By applying the rotating shaft mechanism 100 to the electronic device, the electronic device is enabled to move smoothly during an unfolding process or a folding process, and thus the user comfort can be enhanced.

Figure 3:
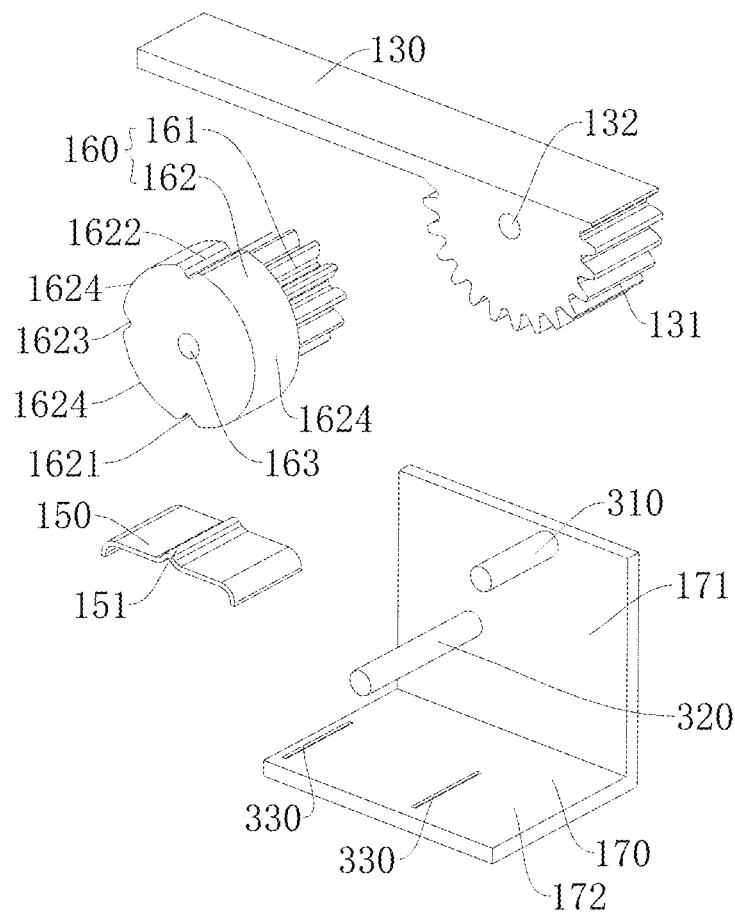
FIG. 3 is an exploded schematic view of a rotating shaft mechanism for folding an electronic device according to some embodiments of the disclosure.

As illustrated in FIG. 3, the supporting frame may include a first connecting plate 171 and a second connecting plate 172, the second connecting plate 172 is connected to an end of the first connecting plate 171, the first connecting plate 171 and the second connecting plate 172 are arranged perpendicular to each other.

As illustrated in FIG. 3, the supporting frame 170 is provided with a first pivot shaft 310, the first pivot shaft 310 is disposed on the first connecting plate 171. The rotating member 130 is provided with a first pivot hole 132, and the first pivot hole 132 is configured to cooperate with the first pivot shaft 310, so as to enable the rotating member 130 to rotatably connect to the first connecting plate 170.

As illustrated in FIG. 3, the supporting frame 170 is provided with a second pivot shaft 320, the second pivot shaft 320 is disposed on the first connecting plate 171 and is spaced apart from the first pivot shaft 310. The transmission member 160 is further provided with a second pivot hole 163, and the second pivot hole 163 is configured to cooperate with the second pivot shaft 320, so as to enable the transmission member 160 to rotatably connect to the supporting frame 170.

As illustrated in FIG. 3, the supporting frame 170 is further provided with a mounting component 330, the mounting component 330 is disposed on the second connecting plate 172, and the resilient piece 150 is mounted on the mounting component 330. The resilient piece 150 may be glued to the mounting component 330. Alternatively, the resilient piece 150 may be welded to the mounting component 330, so that the connection strength between the resilient piece 150 and the mounting component 330 can be enhanced.

As illustrated in FIGS. 2 and 3, the end of the rotating member 130 connected to the supporting frame 170 is provided with a first gear 131, the first gear 131 is configured to rotate coaxially with the rotating member 130. The rotating shaft mechanism 100 further includes a transmission member 160 which is rotatably disposed on the supporting frame 170. The transmission member 160 is engaged with the first gear 131, and the resilient piece 150 abuts against an outer peripheral wall of the transmission member 160 to thereby apply the damping force to the rotating member 130. Specifically, the transmission member 160 includes a second gear 161 engaged with the first gear 131 and a locking wheel 162 coaxial with the second gear 161, and the resilient piece 150 abuts against an outer peripheral wall of the locking wheel 162. In some embodiments, the second gear 161 may be fixed with respect to the locking wheel 162, so that the second gear 161 may drive the first locking wheel 162 to move synchronously.

In this way, when the electronic device is required to be folded or unfolded, the rotating member 130 rotates relative to the supporting frame 170, the first gear 131 is engaged with the second gear 161, so that the second gear 161 is enabled to rotate relative to the supporting frame 170 to drive the rotation of the first locking wheel 162. Since the resilient piece 150 busts against an outer peripheral wall of the first locking wheel 162, there is friction between the resilient piece 150 and the first locking wheel 162, so that the first locking wheel 162 is subjected to a damping force which hinders the rotation of the first locking wheel 162, and the damping force is transmitted, by the first gear 131, to the first rotating member 130 through the second gear 161 and the first gear 131. As such, the first rotating member 130 can be stable in the rotation process.

Referring to FIGS. 2 and 3, the resilient piece 150 is provided with a protrusion 151, and the protrusion 151 abuts against the outer peripheral wall of the locking wheel 162. In this way, the damping force applied to the locking wheel 162 by the resilient piece 150 can be increased, so as to enable the rotation of the transmission member 160 to be stable, so that the folding and unfolding process of the electronic device can be stable. As such, the operating feel of the user can be enhanced.

Figure 4:
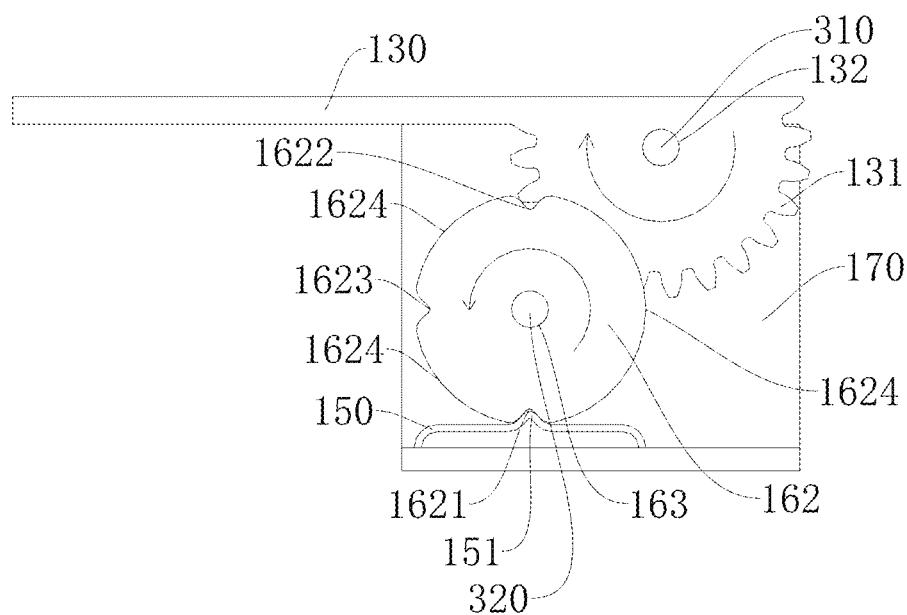
FIG. 4 is a schematic structural diagram illustrating a rotating shaft mechanism for folding an electronic device in an unfolded state according to some embodiments of the disclosure.
Figure 7:
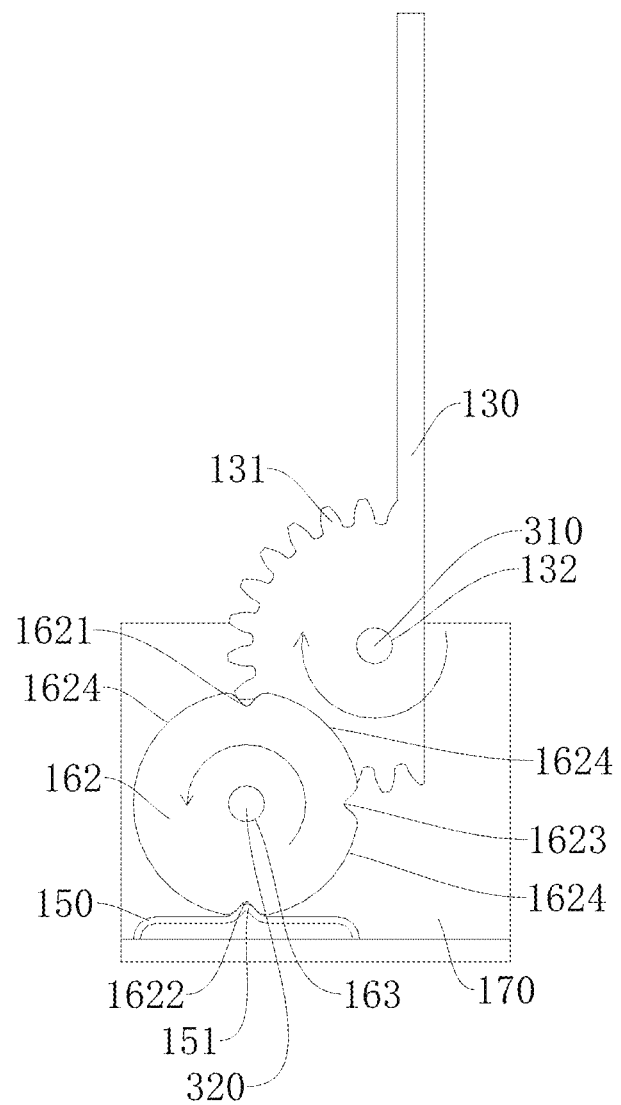
FIG. 7 is a schematic structural diagram illustrating a rotating shaft mechanism for folding an electronic device in a folded state according to some embodiments of the disclosure.

Referring to FIGS. 2 and 3, the outer peripheral wall of the locking wheel 162 is provided with a first locking groove 1621 and a second locking groove 1622, and the first locking groove 1621 and the second locking groove 1622 are spaced apart from each other along a circumferential direction of the first locking wheel 162. The electronic device is capable of being in the unfolded state or the folded state. As illustrated in FIG. 4, the protrusion 151 is matched with the first locking groove 1621 when the electronic device is in the unfolded state. As illustrated in FIG. 7, the protrusion 151 is matched with the second locking groove 1622 when the electronic device is in the folded state. In other words, the first locking groove 1621 and the second locking groove 1622 are configured to limit the shape of the electronic device. The first locking groove 1621 is configured to cooperate with the protrusion 151 to limit the first housing 120 and the second housing 140 to be unfolded relative to each other, and the second locking groove 1622 is configured to cooperate with the protrusion 151 to limit the first housing 120 and the second housing 140 to be folded relative to each other.

It can be understood that, as illustrated in FIG. 4, the matching between the first locking groove 1621 and the protrusion 151 may lock the locking wheel 162. When an external force applied to the locking wheel 162 is not enough to make the first locking groove 1621 pass over the protrusion 151, the locking wheel 162 is in a non-rotating state, and thus the second gear 161, the first gear 131 and the rotating member 130 are in non-rotating states. At this time, the electronic device may maintain in the unfolded state stably, which facilitates the user to use the electronic device. When the user wants to fold the electronic device, the user may apply an external force in a direction towards the second housing 140 to the first housing 120. The external force is transmitted to the locking wheel 162 through the first gear 131 and the second gear 161, thereby enabling the first locking groove 1621 to pass over the protrusion 151. As such, the first housing 120 is enabled to rotate, and when the first housing 120 rotates to a position where the first housing 120 is stacked with the second housing 140, the second locking groove 1622 is matched with the protrusion 151. For example, when the electronic device is switched from the unfolded state to the folded state, the external force may drive the first gear 131 and the rotating member 130 to rotate in directions as the arrows illustrated in FIG. 4. In other words, in response to a folding or an unfolding of the electronic device, the first gear 131 and the rotating member 130 rotate in directions opposite each other.

Similarly, as illustrated in FIG. 7, the matching between the second locking groove 1622 and the protrusion 151 may lock the locking wheel 162. When an external force applied to the locking wheel 162 is not enough to make the second locking groove 1621 pass over the protrusion 151, the locking wheel 162 is in the non-rotating state, and thus the second gear 161, the first gear 131 and the rotating member 130 are in the non-rotating states. At this time, the electronic device may maintain in the folded state stably, which facilitates the user to storage the electronic device. When the user wants to unfold the electronic device, the user may apply an external force far away from the second housing 140 to the first housing 120. The external force is transmitted to the locking wheel 162 through the first gear 131 and the second gear 161, thereby enabling the second locking groove 1622 to pass over the protrusion 151. As such, the first housing 120 is enabled to rotate, and when the first housing 120 rotates to a position where the angle between the first housing 120 and the second housing 140 is 180°, the first locking groove 1621 is matched with the protrusion 151.

Figure 6:
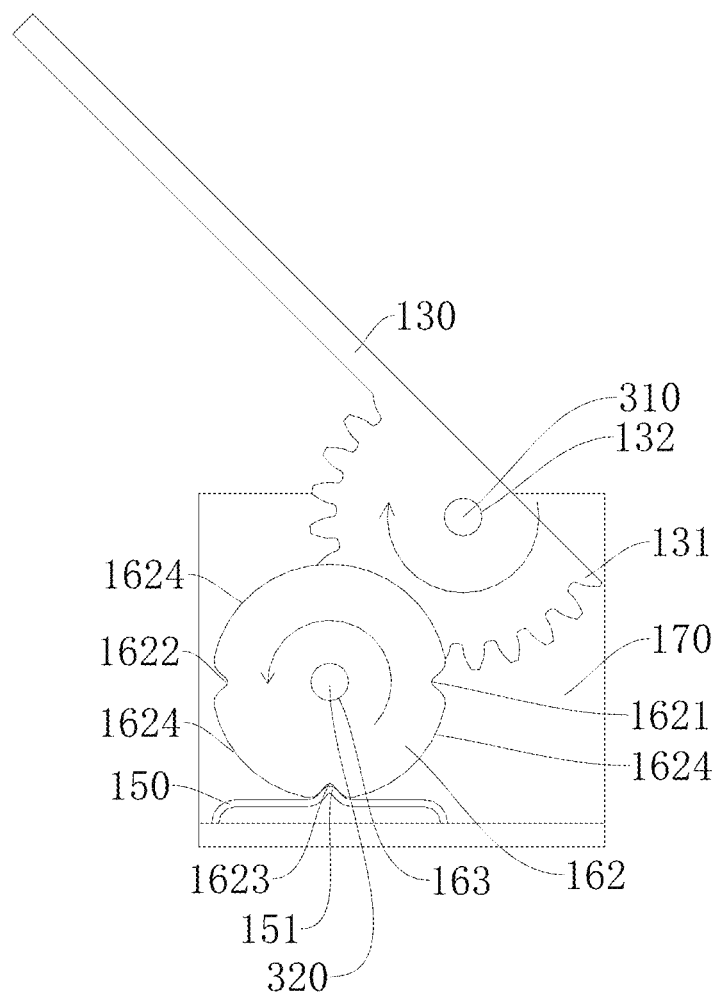
FIG. 6 is another schematic structural diagram illustrating a rotating shaft mechanism for folding an electronic device that is being folded from the unfolded state according to some embodiments of the disclosure.

As illustrated in FIGS. 2 and 3, a limiting groove 1623 is further provided between the first locking groove 1621 and the second locking groove 1622. Referring to FIG. 6, the protrusion 151 is configured to cooperate with the limiting groove 1623 to thereby limit the rotating shaft mechanism 100 to be located at a preset position between the unfolded state and the folded state. It can be understood that, the matching between the limiting groove 1623 and the protrusion 151 may lock the locking wheel 162. When an external force applied on the locking wheel 162 is not enough to make the limiting groove 1623 pass over the protrusion 151, the locking wheel 162 is in the non-rotating state, so that the second gear 161, the first gear 131 and the rotating member 130 are in the non-rotating states, the rotating member 130 is fixed at a preset position, and the electronic device may be fixed stably at a preset position. When the protrusion 151 is matched with different limiting groove 1623, the angle between the first housing 120 and the second housing 140 is different. As such, the user is facilitated to adjust usage angle of the electronic device as needed. For example, when it is difficult to view the screen due to light and other reasons, the user may adjust the angle of the electronic device as needed to see the screen well. For another example, when the user prospects to set the electronic device to an adapted comfortable use angle due to the different sleeping or sitting postures of the user, the user may adjust the electronic device to a specific position as needed. When the user applies an external force to the rotating member 130, the external force is transmitted to the locking wheel 162 through the first gear 131 and the second gear 161, so that the locking groove 1623 is enabled to pass over the protrusion 151, thereby enabling the rotating member 130 to rotate. The second locking groove 1622 is matched with the protrusion 151 when the electronic device is in the folded state; and the first locking groove 1621 is matched with the protrusion 151 when the electronic device is in the unfolded state. It can be understood that, the limiting groove 1623 is configured to limit a shape of the electronic device, and the electronic device is limited to be in a partially folded state when the protrusion 151 is matched with the limiting groove 1623. Sine the limiting groove 1623 is disposed between the first locking groove 1621 and the second locking groove 1622, when the protrusion 151 is matched with the limiting groove 1623, a third angle is formed between the first housing 120 and the second housing 140, and the third angle may be greater than the second angle corresponding to the folded state, i.e., 0°, and be less than the first angle corresponding to the unfolded state, i.e., 180°.

Optionally, there are multiple limiting grooves 1623 spaced apart from one another along the circumferential direction of the locking wheel 162. As such, the rotating shaft mechanism 100 may be limited to be located at various preset positions between the unfolded state and the folded state, so as to meet the user's usage requirements. In other words, the angle between the first housing 120 and the second housing 140 may be limited to various preset degrees.

Figure 5:
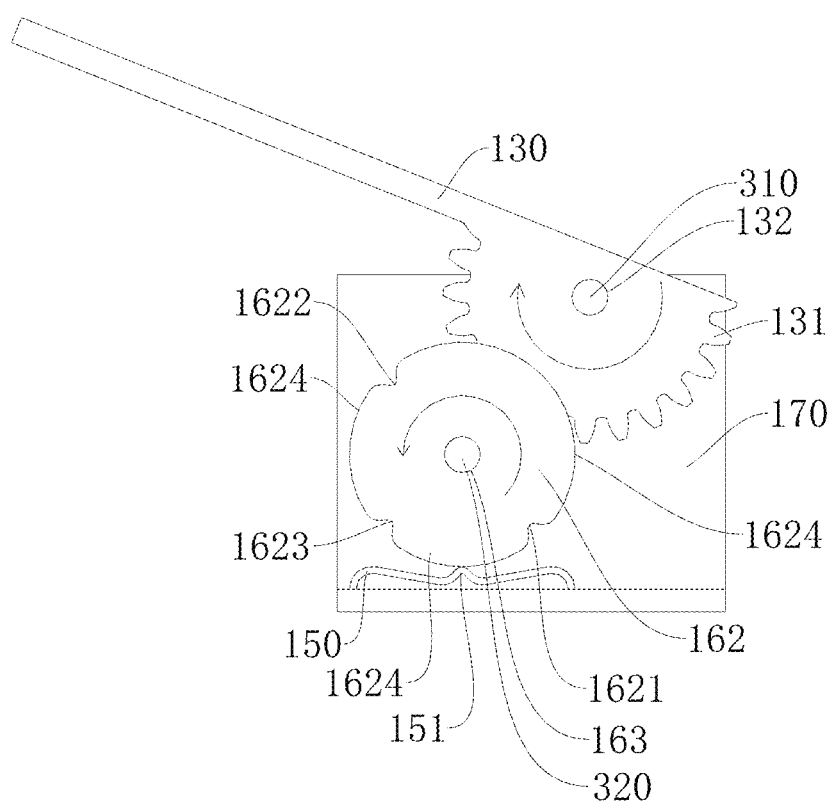
FIG. 5 is a schematic structural diagram illustrating a rotating shaft mechanism for folding an electronic device that is being folded from the unfolded state according to some embodiments of the disclosure.

As illustrated in FIGS. 2 and 3, an area of the outer peripheral wall of the locking wheel 162 other than the first locking groove 1621 and the second locking groove 1622 forms multiple damping parts 1624, the multiple damping parts 1624 are spaced apart from one another along a circumferential direction of the locking wheel 162. Referring to FIG. 5, the protrusion 151 abuts against one of the multiple damping parts 1624 to apply the damping force to the locking wheel 162. During the rotation of the rotating member 130, the rotating member 130 drives the one of the multiple damping parts 1624 to abut against the protrusion 151, the resilient piece 150 is pressed down. At this time, the resilience of the resilient piece 150 increases, the friction force between the resilient piece 150 and the damping part 1624 increases, thus generating a damping force larger than that before the resilient piece 150 is pressed down, so that the rotating member 130 can rotate smoothly. When the rotating member 130 continues to rotate, the protrusion 151 is into, i.e., matched with, one of the first locking groove 1621, the second locking groove 1622 and the limiting groove 1623, at this time, the first housing 120 and the second housing 140 of the electronic device may be locked to maintain a specific angle. In some embodiments, the surface of the protrusion 151 may be rough to improve the friction force between the resilient piece 150 and the damping part 1624.

Specifically, a reference diameter of the second gear 131 may be denoted as d1, a reference diameter of the second gear 161 may be denoted as d2, and the d1 and the d2 meets the expression: d1>d2. A rotation speed of the first gear 131 may be denoted as n1, a rotation speed of the second gear 161 may be denoted as n2, and since the first gear 131 is engaged with the second gear 161, it is available to get n1<n2 according to the equation n1/n2=d2/d1. As such, the second gear 161 may magnify the angle of movement of the rotating member 130, so that a large area of the outer peripheral wall of the locking wheel 162 is enabled to slide relative to the resilient piece 150, and thus the locking wheel 162 has enough space to dispose the locking groove 1623 and the damping part 1624.

Furthermore, the d1 and the d2 further meet the expression: d1/d2=2. In this way, the second gear 161 may magnify the angle of movement of the rotating member 130 by 2 times. For example, when the rotating member 130 rotates by 90°, the second gear 161 may rotate by 180°, so that half of the outer peripheral wall surface of the locking wheel 162 is enabled to slide relative to the resilient piece 150. As such, the locking wheel 162 has enough space to dispose the locking groove 1623 and the damping part 1624.

As illustrated in FIG. 1, the housing assembly 1000 for folding the electronic device according to the disclosure includes a fixed shaft 110, two rotating shaft mechanisms 100 for folding the electronic device as described above, a first housing 120, and a second housing 140. Both of the supporting frames 170 of the two rotating shaft mechanisms 100 are disposed on the fixed shaft 110 and are spaced apart from each other. The first housing 120 is fixedly connected to the end of the rotating member 130 of one rotating shaft mechanism 100 that is far away from the corresponding supporting frame 170, the second housing 140 is fixedly connected to the end of the rotating member 130 of the other rotating shaft mechanism 100 that is far away from the corresponding supporting frame 170. That is, one side of the rotating member 130 is rotatably disposed on the supporting frame, and the other side of the rotating member 130 is fixedly connected to the first housing 120 or the second housing 140. When the electronic device is in the folded state, the first housing 120 and the second housing 140 are arranged to be stacked. As such, the first housing 120 and the second housing 140 may be fold and unfolded through the rotating shaft mechanism 100.

Specifically, the two rotating shaft mechanism 100 may be spaced apart from each other along an axial direction of the fixed shaft 110, or may be alternatively spaced apart from each other along a direction perpendicular to the axial direction of the fixed shaft 110. The disclosure is not limited to these examples.

Specifically, the supporting frame 170 may reliably support the rotating member 130, the transmission member 160 and the resilient piece 150. After the rotating member 130, the transmission member 160 and the resilient piece 150 are mounted on the bracket 170, the above components are mounted on the fixed shaft 110 as a whole, which can facilitate the mounting of the rotating member 130, the transmission member 160 and the resilient piece 150. Optionally, the two rotating shaft mechanism 100 may share one supporting frame 170, that is, the rotating members 130, the transmission members 160, and the resilient pieces 150 of the two rotating shaft mechanism 100 are all mounted on the one supporting frame 170.

Specifically, when the first housing 120 is manually rotated in a direction towards the second housing 140, the first housing 120 may drive the rotating member 130 to rotate relative to the fixed shaft 110, thereby folding the first housing 120 towards the second housing 140. At this time, the first housing 120 and the second housing 140 are arranged to be stacked. When the first housing 120 is manually rotated in a direction far away from the second housing 140, the first housing 120 may drive the rotating member 130 to rotate relative to the fixed shaft 110, thereby unfolding the first housing 120 and the second housing 140. At this time, the first housing 120 and the second housing 140 are located in the same plane, and the first housing 120 is rotated to a position where the angle between the first housing 120 and the second housing 140 is 180°. During the rotation of the rotating member 130, the resilient piece 150 may apply the damping force to the rotating member 130 to hinder the rotation of the rotating member 130, so that the rotation process of the rotating member 130 may be more stable, thereby enabling the first housing 120 to move towards or far away from the second housing 140 smoothly. In this way, the user comfort can be enhanced.

Regarding the housing assembly 1000 according to the disclosure, by providing the resilient piece 150, the resilient piece 150 is configured to apply the damping force to the rotating member 130, so that the rotating member 130 can rotate smoothly. In this way, by the application of the rotating shaft mechanism 100 to the housing assembly 1000, the electronic device is enabled to move steadily during an unfolding process or a folding process, and thus the user comfort can be enhanced.

Furthermore, as illustrated in FIGS. 2 and 3, the end of the rotating member 130 connected to the supporting frame 170 is provided with the first gear 131, the first gear 131 is configured to rotate coaxially with the rotating member 130. The rotating shaft mechanism 100 further includes the transmission member 160 which is rotatably disposed on the supporting frame 170, the transmission member 160 includes the second gear 161 engaged with the first gear 131 and the locking wheel 162 coaxial with the second gear 161, and the resilient piece 150 abuts against an outer peripheral wall of the locking wheel 162.

When the electronic device is required to be folded or unfolded, the rotating member 130 is manually rotated in a direction towards or far away from the second housing 140, the first housing 120 may drive the rotating member 130 to rotate relative to the fixed shaft 110, the second gear 161 is enabled, through the engagement between the first gear 131 and the second gear 161, to rotate relative to the supporting frame 170, so as to drive the rotation of the first locking wheel 162. Since the resilient piece 150 abuts against an outer peripheral wall of the first locking wheel 162, there is friction between the resilient piece 150 and the first locking wheel 162, so that the first locking wheel 162 is subjected to a damping force which hinders the rotation of the first locking wheel 162, and the damping force is transmitted, by the first gear 131, to the first rotating member 130 through the second gear 161 and the first gear 131. As such, the first rotating member 130 can be stable in the rotation process.

Furthermore, referring to FIGS. 2 and 3, the outer peripheral wall of the locking wheel 162 is provided with the first locking groove 1621 and the second locking groove 1622, and the first locking groove 1621 and the second locking groove 1622 are spaced apart from each other along the circumferential direction of the first locking wheel 162. The electronic device is capable of being in the unfolded state or the folded state. As illustrated in FIG. 4, the protrusion 151 is matched with the first locking groove 1621 when the electronic device is in the folded state. As illustrated in FIG. 7, the protrusion 151 is matched with the second locking groove 1622 when the electronic device is in the folded state. It can be understood that, the matching between the first locking groove 1621 and the protrusion 151 may lock the locking wheel 162. When an external force applied to the locking wheel 162 is not enough to make the first locking groove 1621 pass over the protrusion 151, the locking wheel 162 is in a non-rotating state, and thus the second gear 161, the first gear 131 and the rotating member 130 are in non-rotating states. At this time, the electronic device may maintain in the unfolded state stably, which facilitates the user to use the electronic device. When the user wants to fold the electronic device, the user may apply an external force in a direction towards the second housing 140 to the first housing 120. The external force is transmitted to the locking wheel 162 through the first gear 131 and the second gear 161, thereby enabling the first locking groove 1621 to pass over the protrusion 151. As such, the first housing 120 is enabled to rotate, and when the first housing 120 rotates to a position where the first housing 120 is stacked with the second housing 140, the second locking groove 1622 is matched with the protrusion 151.

Similarly, the matching between the second locking groove 1622 and the protrusion 151 may lock the locking wheel 162. When an external force applied to the locking wheel 162 is not enough to make the second locking groove 1621 pass over the protrusion 151, the locking wheel 162 is in the non-rotating state, and thus the second gear 161, the first gear 131 and the rotating member 130 are in the non-rotating states. At this time, the electronic device may maintain in the folded state stably, which facilitates the user to storage the electronic device. When the user wants to unfold the electronic device, the user may apply an external force far away from the second housing 140 to the first housing 120. The external force is transmitted to the locking wheel 162 through the first gear 131 and the second gear 161, thereby enabling the second locking groove 1622 to pass over the protrusion 151. As such, the first housing 120 is enabled to rotate, and when the first housing 120 rotates to a position where the angle between the first housing 120 and the second housing 140 is 180°, the first locking groove 1621 is matched with the protrusion 151.

As illustrated in FIGS. 2 and 3, a limiting groove 1623 is further provided between the first locking groove 1621 and the second locking groove 1622. Referring to FIG. 6, the protrusion 151 is configured to cooperate with the limiting groove 1623 to thereby limit the rotating shaft mechanism 100 to be at a preset position between the unfolded state and the folded state. It can be understood that, the matching between the limiting groove 1623 and the protrusion 151 may lock the locking wheel 162. When an external force applied on the locking wheel 162 is not enough to make the limiting groove 1623 pass over the protrusion 151, the locking wheel 162 is in the non-rotating state, so that the second gear 161, the first gear 131 and the rotating member 130 are in the non-rotating states, the rotating member 130 is fixed at a preset position, and the housing 120 may be fixed stably at a preset position. As such, the user is facilitated to adjust usage angle of the electronic device as needed. For example, when it is difficult to view the screen due to light and other reasons, the user may adjust the angle of the electronic device as needed to see the screen well. For another example, when the user prospects to set the electronic device to an adapted comfortable use angle due to the different sleeping or sitting postures of the user, the user may adjust the electronic device to a specific position as needed. When the user applies an external force in the direction towards or far away from the second housing 140 to the first housing 120, the external force is transmitted to the locking wheel 162 through the first gear 131 and the second gear 16, so that the locking groove 1623 is enabled to pass over the protrusion 151, thereby enabling the first housing 120 to rotate. When the first housing is rotated to be stacked with the second housing 140, the second locking groove 1622 is matched with the protrusion 151. When the first housing 120 is rotated to a position where the angle between the first housing 120 and the second housing 140 is 180°, the first limiting groove 1621 is matched with the protrusion 151. In some embodiments, when the first housing 120 and the second housing 140 are folded relative to each other, each of the two second limiting grooves 1623 is matched with the corresponding protrusion 151; and when the first housing 120 and the second housing 140 are unfolded relative to each other, each of the two first limiting grooves 1621 is matched with the corresponding protrusion 151.

Figure 8:
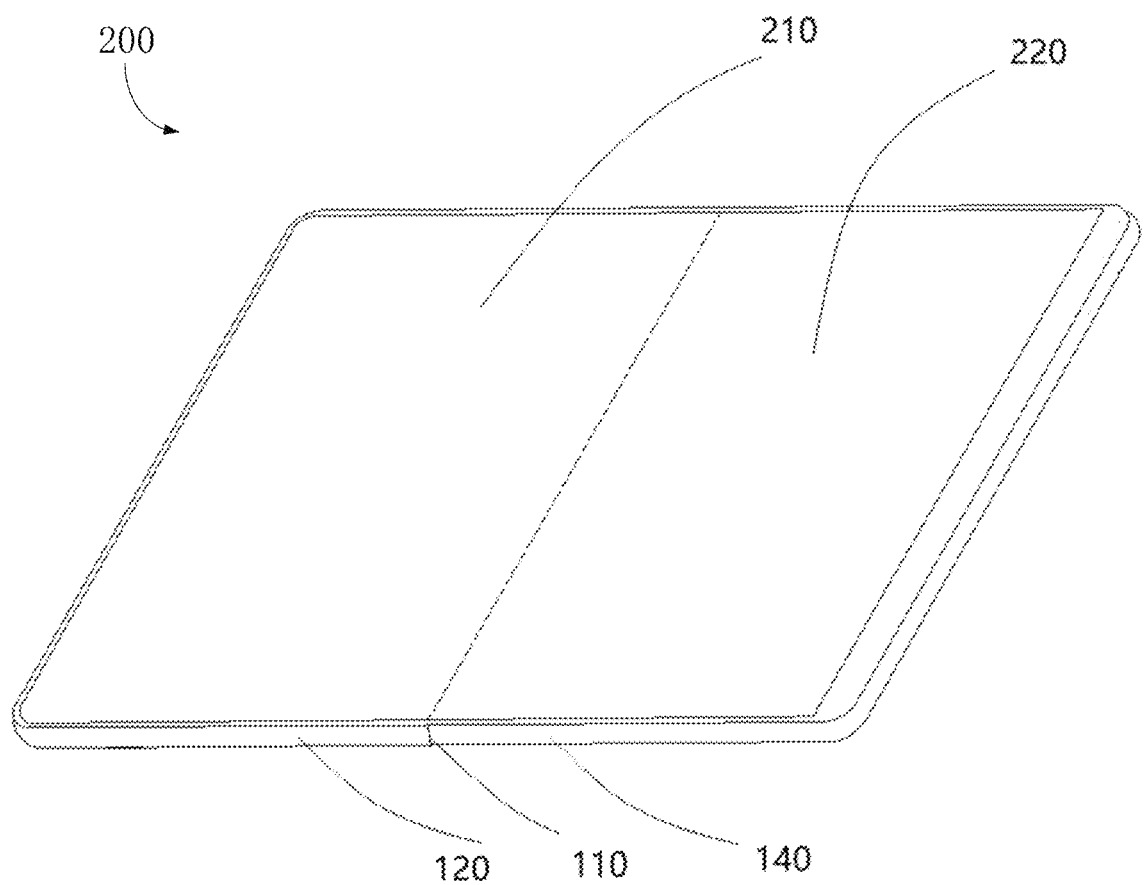
FIG. 8 is a schematic structural diagram illustrating an electronic device according to some embodiments of the disclosure.

As illustrated in FIG. 8, the electronic device according to the disclosure includes the above housing assembly 1000 and a display screen, a portion 210 of the display screen is disposed on the first housing 120, and another portion 220 of the display screen is disposed on the second housing 140.

Regarding the electronic device according to the disclosure, by providing the resilient piece 150, the resilient piece 150 is configured to apply the damping force to the rotating member 130, so that the rotating member 130 can rotate smoothly. In this way, by applying the rotating shaft mechanism 100 in the electronic device, the electronic device is enabled to move steadily during an unfolding process or a folding process, and thus the operating feel of the user can be enhanced.

For example, the electronic device may be any one of various mobile or portable computer system devices which are able to realize wireless communication. Specifically, Specifically, the electronic device may be a mobile phone or a smart phone (e.g., a phone based on iPhone™ or Android™), a portable game device (e.g., Nintendo DS™, PlayStation Portable™, Gameboy Advance™, iPhone™), a laptop computer, a personal digital assistant (PDA), a portable internet terminal device, a music player and a storage device or other handset device (e.g., a watch, an in-ear earphone, a pendant, a headphone, etc.). The electronic device may also be other wearable devices (e.g., electronic glasses, electronic clothes, electronic bracelets, electronic necklaces, electronic tattoos, electronic devices, smart watches and head-mounted devices (HMD)).

The electronic device may be any one of a plurality of electronic devices including, but not limited to, a cellular phone, a smart phone, other wireless communication devices, a personal digital assistant, an audio player, other media player, a music recorder, a video recorder, a camera, other media recorder, radio, a medical equipment, a vehicle transportation equipment, a calculator, a programmable remote controller, a pager, a laptop computer, a desktop computer, a printer, a netbook computer, a personal digital assistant (PDA), a portable multimedia player (PMP), a motion picture expert group (MPEG-1 or MPEG-2) audio player 3 (MP3), a portable medical equipment, a digital camera or any combination thereof.

In some cases, the electronic device may perform various functions (e.g., playing music, showing video, storing pictures and transmitting/receiving telephone calls). If desired, the electronic device may be a cell phone, a media player, other handset devices, a wrist watch device, a pendant device, an earpiece device or other compact portable devices.

In the description of the specification, the description with reference to the terms "one embodiment", "some embodiments", "illustrative embodiment", "example", "specific example", or "some examples", and the like, means that a specific feature, structure, material, or characteristic described in connection with the embodiment or example is included in at least one embodiment or example of the disclosure. Thus, the illustrative descriptions of the terms throughout this specification are not necessarily referring to the same embodiment or example of the disclosure. Furthermore, the specific features, structures, materials, or characteristics may be combined in any suitable manner in one or more embodiments or examples.

Although embodiments of disclosure have been illustrated and described above, it may be understood by those skilled in the art that, changes, modifications, replacements, and alternatives can be made to these embodiments without departing from the principle and purpose of the present application, and the scope of the present application is limited by the claims and equivalents thereof.

What is claimed is:

1. A rotating shaft mechanism for folding an electronic device, comprising:
    a supporting frame;
    a rotating member, wherein an end of the rotating member is rotatably disposed on the supporting frame; and
    a resilient piece configured to apply a damping force to the rotating member, wherein the resilient piece is disposed on the supporting frame;
    wherein the supporting frame comprises a first connecting plate and a second connecting plate, the second connecting plate is connected to an end of the first connecting plate, the first connecting plate and the second connecting plate are arranged perpendicular to each other, the end of the rotating member rotatably disposed on the supporting frame is rotatably disposed on the first connecting plate, and the resilient piece is disposed on the second connecting plate.

2. The rotating shaft mechanism for folding the electronic device according to claim 1, wherein the end of the rotating member rotatably disposed on the supporting frame is provided with a first gear, the first gear is configured to rotate coaxially with the rotating member, and the rotating shaft mechanism further comprises:
    a transmission member, wherein the transmission member is rotatably disposed on the supporting frame, the transmission member comprises a second gear engaged with the first gear and a locking wheel coaxial with the second gear, and the resilient piece abuts against an outer peripheral wall of the locking wheel.

3. The rotating shaft mechanism for folding the electronic device according to claim 2, wherein the resilient piece is provided with a protrusion, and the protrusion abuts against the outer peripheral wall of the locking wheel.

4. The rotating shaft mechanism for folding the electronic device according to claim 3, wherein the outer peripheral wall of the locking wheel is provided with a first locking groove and a second locking groove, the first locking groove and the second locking groove are spaced apart along a circumferential direction of the locking wheel, the electronic device is capable of being in an unfolded state or a folded state, the protrusion is matched with the first locking groove when the electronic device is in the unfolded state, and the protrusion is matched with the second locking groove when the electronic device is in the folded state.

5. The rotating shaft mechanism for folding the electronic device according to claim 4, wherein an area of the outer peripheral wall of the locking wheel other than the first locking groove and the second locking groove forms a plurality of damping parts, the plurality of damping parts are spaced apart along a circumferential direction of the locking wheel, and the protrusion abuts against one of the plurality of damping parts to thereby apply a damping force to the locking wheel.

6. The rotating shaft mechanism for folding the electronic device according to claim 4, wherein a limiting groove is further provided between the first locking groove and the second locking groove, and the protrusion is configured to cooperate with the limiting groove to thereby limit the electronic device to be in a partially folded state.

7. The rotating shaft mechanism for folding the electronic device according to claim 6, wherein a quantity of the limiting groove is a plurality, and the plurality of limiting grooves are spaced apart along the circumferential direction of the locking wheel.

8. The rotating shaft mechanism for folding the electronic device according to claim 2, wherein a reference diameter of the first gear is denoted as d1, a reference diameter of the second gear is denoted as d2, and the rotating shaft mechanism meets the expression: d1>d2.

9. The rotating shaft mechanism for folding the electronic device according to claim 8, wherein the d1 and the d2 further meet the expression: d1/d2=2.

10. The rotating shaft mechanism for folding the electronic device according to claim 1, wherein the supporting frame is provided with a first pivot shaft, the first pivot shaft is disposed on the first connecting plate, the rotating member is provided with a first pivot hole, and the first pivot hole is configured to cooperate with the first pivot shaft to thereby enable the rotating member to rotatably connect to the first connecting plate.

11. The rotating shaft mechanism for folding the electronic device according to claim 10, wherein the supporting frame is further provided with a second pivot shaft, both of the first pivot shaft and the second pivot shaft are arranged at the first connecting plate and spaced apart, the transmission member is provided with a second pivot hole, and the second pivot hole is configured to cooperate with the second pivot shaft to thereby enable the transmission member to rotatably connect to the supporting frame.

12. The rotating shaft mechanism for folding the electronic device according to claim 1, wherein the supporting frame is provided with a mounting component, the mounting component is disposed on the second connecting plate, and the resilient piece is mounted on the mounting component.

13. The rotating shaft mechanism for folding the electronic device according to claim 12, further comprising a second mounting component, and each of the two mounting components are spaced apart along an extension direction of the resilient piece, and two ends of the resilient piece cooperate with the two mounting components, respectively.

14. A housing assembly, comprising:
a fixed shaft;
two rotating shaft mechanisms, wherein for each of the two rotating shaft mechanisms, the rotating shaft mechanisms comprises a supporting frame, a rotating member, and a resilient piece, an end of the rotating member is rotatably disposed on the supporting frame, the resilient piece is disposed on the supporting frame and configured to apply a damping force to the rotating member, and both of the supporting frames of the two rotating shaft mechanisms are disposed on the fixed shaft and spaced apart;
a first housing, wherein the first housing is fixedly connected to an end of the rotating member of one of the two rotating shaft mechanisms that is far away from the corresponding supporting frame; and
a second housing, wherein the second housing is fixedly connected to an end of the rotating member of the other one of the two rotating shaft mechanisms that is far away from the corresponding supporting frame;
wherein for each of the two rotating shaft mechanisms, the end of the rotating member rotatably disposed on the supporting frame is provided with a first gear, the first gear is configured to rotate coaxially with the rotating member; and the rotating shaft mechanism further comprises a transmission member rotatably disposed on the supporting frame, the transmission member comprises a second gear engaged with the first gear and a locking wheel coaxial with the second gear, and the resilient piece abuts against an outer peripheral wall of the locking wheel;
a reference diameter of the first gear is denoted as d1, a reference diameter of the second gear is denoted as d2, and the rotating shaft mechanism meets the expression: $d1>d2$.

15. The housing assembly according to claim 14, wherein for each of the two rotating shaft mechanisms, and the outer peripheral wall of the locking wheel is provided with a first locking groove and a second locking groove; and
wherein the resilient piece is provided with a protrusion; the first locking groove is configured to cooperate with the protrusion to limit the first housing and the second housing to be unfolded relative to each other, and the second locking groove is configured to cooperate with the protrusion to limit the first housing and the second housing to be folded relative to each other.

16. The housing assembly according to claim 15, wherein for each of the two rotating shaft mechanisms, a limiting groove is further provided between the first locking groove and the second locking groove; and
wherein a first angle is formed between the first housing and the second housing when the protrusion is matched with the first locking groove, and a second angle is formed between the first housing and the second housing when the protrusion is matched with the second locking groove, a third angle is formed between the first housing and the second housing when the protrusion is matched with the limiting groove, and the third angle is less than the first angle and greater than the second angle.

17. The housing assembly according to claim 14, wherein for each of the two rotating shaft mechanisms, the supporting frame comprises a first connecting plate and a second connecting plate, the second connecting plate is connected to an end of the first connecting plate, the first connecting plate and the second connecting plate are arranged perpendicular to each other, the first gear is rotatably disposed on the first connecting plate, and the resilient piece is disposed on the second connecting plate.

18. An electronic device, comprising:
a fixed shaft;
two rotating shaft mechanisms, wherein for each of the two rotating shaft mechanisms, the rotating shaft mechanisms comprises a supporting frame, a rotating member, and a resilient piece, an end of the rotating member is rotatably disposed on the supporting frame, the resilient piece is disposed on the supporting frame and configured to apply a damping force to the rotating member, and both of the supporting frames of the two rotating shaft mechanisms are disposed on the fixed shaft and spaced apart;
a first housing, wherein the first housing is fixedly connected to an end of the rotating member of one of the two rotating shaft mechanisms that is far away from the corresponding supporting frame;
a second housing, wherein the second housing is fixedly connected to an end of the rotating member of the other one of the two rotating shaft mechanisms that is far away from the corresponding supporting frame, and the first housing and the second housing are arranged to be stacked when the electronic device is in a folded state; and
a display screen, wherein a portion of the display screen is disposed on the first housing, and another portion of the display screen is disposed on the second housing;
wherein for each of the two rotating shaft mechanisms, the supporting frame comprises a first connecting plate and a second connecting plate, the second connecting plate is connected to an end of the first connecting plate, the first connecting plate and the second connecting plate are arranged perpendicular to each other, the end of the rotating member rotatably disposed on the supporting frame is rotatably disposed on the first connecting plate, and the resilient piece is disposed on the second connecting plate.

19. The electronic device according to claim 18, wherein for each of the two rotating shaft mechanisms, the supporting frame is provided with a first pivot shaft and a second pivot shaft, both of the first pivot shaft and the second pivot shaft are arranged at the first connecting plate and spaced apart, the rotating member is provided with a first pivot hole, the first pivot hole is configured to cooperate with the first pivot shaft to thereby enable the rotating member to rotatably connect to the first connecting plate, the transmission member is provided with a second pivot hole, and the second pivot hole is configured to cooperate with the second pivot shaft to thereby enable the transmission member to rotatably connect to the supporting frame.

20. The electronic device according to claim 18, wherein for each of the two rotating shaft mechanisms,
the end of the rotating member rotatably disposed on the supporting frame is provided with a first gear, the first gear is configured to rotate coaxially with the rotating member; and the rotating shaft mechanism further comprises a transmission member rotatably disposed on the supporting frame, the transmission member comprises a second gear engaged with the first gear and a locking wheel coaxial with the second gear, and the resilient piece abuts against an outer peripheral wall of the locking wheel;

a reference diameter of the first gear is denoted as d1, a reference diameter of the second gear is denoted as d2, and the rotating shaft mechanism meets the expression: d1>d2.

* * * * *